United States Patent [19]
Takeuchi et al.

[11] Patent Number: 6,133,587
[45] Date of Patent: *Oct. 17, 2000

[54] SILICON CARBIDE SEMICONDUCTOR DEVICE AND PROCESS FOR MANUFACTURING SAME

[75] Inventors: Yuichi Takeuchi, Oobu; Takeshi Miyajima, Kariya; Norihito Tokura, Okazaki; Hiroo Fuma, Ichinomiya; Toshio Murata, Seto; Takamasa Suzuki, Nagoya; Shoichi Onda, Toyokawa, all of Japan

[73] Assignee: Denso Corporation, Kariya, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/023,280

[22] Filed: Feb. 13, 1998

Related U.S. Application Data

[63] Continuation-in-part of application No. 08/785,952, Jan. 22, 1997, Pat. No. 5,744,826.

[30] Foreign Application Priority Data

| Jan. 23, 1996 | [JP] | Japan | 8-009625 |
| Feb. 14, 1997 | [JP] | Japan | 9-030409 |
| Feb. 14, 1997 | [JP] | Japan | 9-030410 |

[51] Int. Cl.$^7$ .............................................. H01L 31/0312
[52] U.S. Cl. .............................. 257/77; 257/77; 257/331; 257/354
[58] Field of Search ............................... 257/354, 77, 331

[56] References Cited

U.S. PATENT DOCUMENTS

| 4,697,201 | 9/1987 | Mihara | 357/41 |
| 4,859,621 | 8/1989 | Einthoven . | |

(List continued on next page.)

FOREIGN PATENT DOCUMENTS

| 656 661 | 6/1995 | European Pat. Off. . |
| 657 947 | 6/1995 | European Pat. Off. . |
| 657 992 | 6/1995 | European Pat. Off. . |
| 0 676 814 | 10/1995 | European Pat. Off. . |
| 1-196873 | 8/1989 | Japan . |

(List continued on next page.)

OTHER PUBLICATIONS

"Silicon Carbide and Related Materials", Inst. of Phys. Conf. Series. No. 137, Proceedings of the 5th Conference, Washington DC, Nov. 1–3 1993, pp. 55–58.

S. Zairno, et al. "Effects of Oxidation Conditions on Electrical Properties of SiC–SiO$_2$ Interfaces" J. Appl. Phys. 68 Dec. 15, 1990, pp. 6304–6308.

(List continued on next page.)

*Primary Examiner*—David Hardy
*Assistant Examiner*—Edgardo Ortiz
*Attorney, Agent, or Firm*—Pillsbury Madison & Sutro LLP

[57] ABSTRACT

A n$^-$-type source region 5 is formed on a predetermined region of the surface layer section of the p-type silicon carbide semiconductor layer 3 of a semiconductor substrate 4. A low-resistance p-type silicon carbide region 6 is formed on a predetermined region of the surface layer section in the p-type silicon carbide semiconductor layer 3. A trench 7 is formed in a predetermined region in the n$^+$-type source region 5, which trench 7 passes through the n$^+$-type source region 5 and the p-type silicon carbide semiconductor layer 3, reaching the n$^-$-type silicon carbide semiconductor layer 2. The trench 7 has side walls 7a perpendicular to the surface of the semiconductor substrate 4 and a bottom side 7b parallel to the surface of the semiconductor substrate 4. The hexagonal region surrounded by the side walls 7a of the trench 7 is an island semiconductor region 12. A high-reliability gate insulating film 8 is obtained by forming a gate insulating layer on the side walls 7a which surround the island semiconductor region 12.

7 Claims, 11 Drawing Sheets

U.S. PATENT DOCUMENTS

| | | | |
|---|---|---|---|
| 5,168,331 | 12/1992 | Yilmaz | 257/331 |
| 5,170,231 | 12/1992 | Fuji et al. . | |
| 5,233,215 | 8/1993 | Baligna . | |
| 5,323,040 | 6/1994 | Baligna . | |
| 5,389,799 | 2/1995 | Uemoto . | |
| 5,399,515 | 3/1995 | Davis et al. . | |
| 5,506,421 | 4/1996 | Palmour | 257/77 |
| 5,510,632 | 4/1996 | Brown et al. | 257/77 |
| 5,614,749 | 3/1997 | Ueno | 257/77 |
| 5,736,753 | 4/1998 | Ohno et al. | 257/77 |
| 5,747,831 | 5/1998 | Loose et al. | 257/77 |
| 5,864,159 | 1/1999 | Takahashi | 257/330 |
| 5,866,931 | 2/1999 | Bulucca et al. | 257/331 |

FOREIGN PATENT DOCUMENTS

| | | |
|---|---|---|
| 2- 91976 | 3/1990 | Japan . |
| 2-86171 | 3/1990 | Japan . |
| 2-91976 | 3/1990 | Japan . |
| 4-239778 | 8/1992 | Japan . |
| 5-102497 | 4/1993 | Japan . |
| 7-131016 | 5/1995 | Japan . |
| 7-326755 | 12/1995 | Japan . |
| 8-70124 | 3/1996 | Japan . |
| 8-316467 | 11/1996 | Japan . |
| 9-504656 | 5/1997 | Japan . |

OTHER PUBLICATIONS

Proceedings of the 28th Intersociety Energy Conversion Engineering Conference, vol. 1, Aug. 8, 1993, pp. 55–58.

Inst. Phys. Conf. Ser. No. 137, chapter 1, Paper presented at the 5th. sic. and Related Materials Conf. Washington DC 1993 pp 55–58.

Proceedings of 3rd Conference of SIC and Related Wide Gap Semiconductor Study Group, Oct. 27–28, 1994, P. 27.

Japan J. Appln. Phys., vol. 21, No. 4 Apr. 4, 1982, pp. 579–585.

Japan J. Appln./Phys, vol. 34, Part 1, No. 10, Oct. 1995, pp. 5567–5573.

B.Jayant Baliga "Critical Nature of Oxide/Interface Quality for Sic. Power Devices" Microelectronic Engineering, vol. 28, No. 1/04, Jul. 1995.

Fig.1A
(PRIOR ART)
Fig.1B
(PRIOR ART)
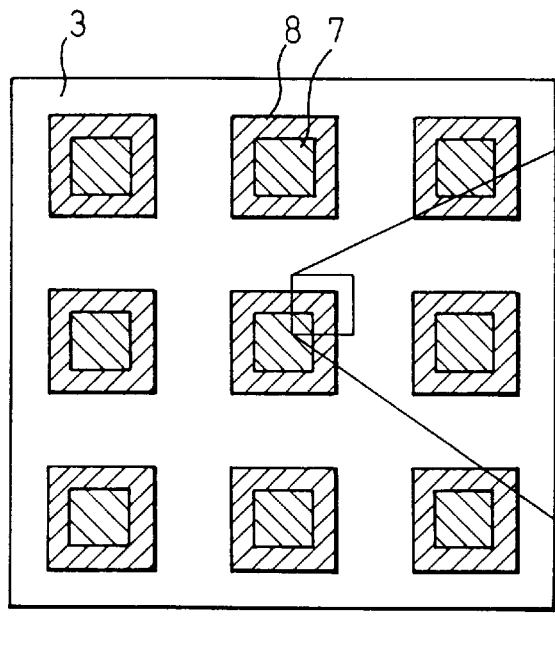
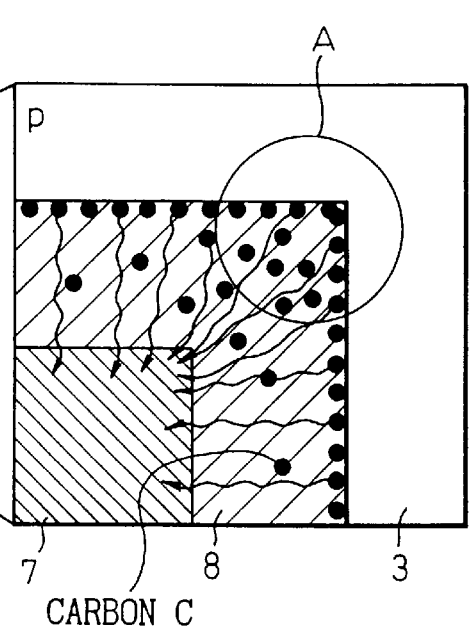
Fig.2A
Fig.2B
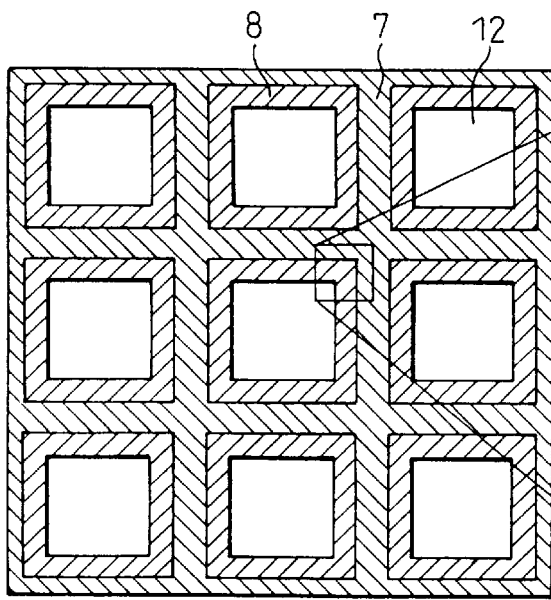
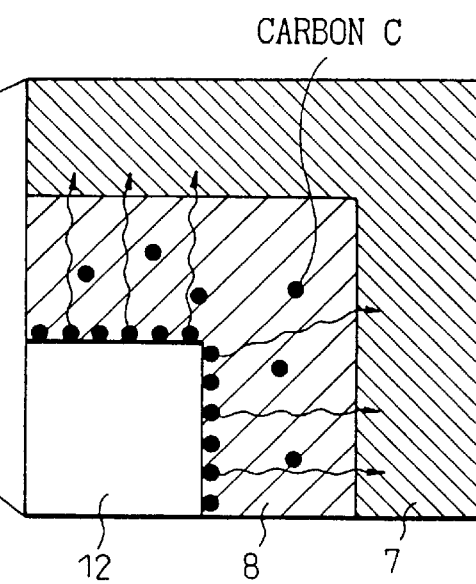

ROUND TABLE

2 μm

[11$\bar{2}$0]
[10$\bar{1}$0]

SILICON CARBIDE SEMICONDUCTOR DEVICE AND PROCESS FOR MANUFACTURING SAME

CROSS REFERENCE TO RELATED APPLICATION

This application is a continuation-in-part application of U.S. patent application Ser. No. 08/785,952, filed on Jan. 22, 1997 now U.S. Pat. No. 5,744,826.

BACKGROUND OF THE INVENTION

1. Field of the Invention

The present invention relates to a silicon carbide semiconductor device and to a process for manufacturing same, and, for example, it relates to high-power vertical-insulating gate-type field effect transistors.

2. Description of the Related Art

In recent years there have been proposed vertical power MOSFETs fabricated using silicon carbide monocrystal materials as the power transistors. Such devices have trenches from the substrate surface to the semiconductor substrate, with the sides of the trenches acting as the channel regions. Power transistors require a low leak current between source and drain during gate voltage off times and a low resistance between source and drain during on times (hereunder referred to as "on resistance") and, in order to meet these requirements, power transistors which make use of the advantageous electronic properties of hexagonal silicon carbide to provide effective reduction in lead current during application of high voltage and reduction in on resistance are described, for example, in Japanese Unexamined Patent Publication No. 7-131016 and Japanese Unexamined Patent Publication No. 7-326755.

However, the trench gate-type power MOSFETs described in Japanese Unexamined Patent Publication No. 7-131016 and No. 7-326755 do not necessarily provide improved channel mobility, and still have a problem of high on resistance. Another problem has been the short life of the gate insulating films compared to those in silicon MOSFETs.

It is therefore an object of the present invention to provide a transistor which is a vertical insulating gate-type field effect transistor made of silicon carbide and having a highly reliable gate insulating film, as well as a process for its manufacture, and also to provide a transistor which allows improved channel mobility and an effective reduction of on time resistance, as well as a process for its manufacture.

SUMMARY OF THE INVENTION

To attain the above object, the present invention provides a silicon carbide semiconductor device comprising a single crystal silicon carbide semiconductor substrate comprising a stack with a first semiconductor layer of a first conductive-type, a second semiconductor layer of the first conductive-type having an electric resistance higher than that of the first semiconductor layer, and a third semiconductor layer of a second conductive-type different from the first conductive-type in this order from the bottom to the top thereof, the single crystal silicon carbide semiconductor substrate having a main surface on a side of the third semiconductor layer; a first semiconductor region of the first conductive-type formed in a predetermined region of the third semiconductor layer; a trench extending from the main surface through the first semiconductor region and the third semiconductor layer and reaching the second semiconductor layer, the trench having a side wall exposing the first semiconductor region and the third semiconductor layer and a bottom exposing the second semiconductor layer; an island semiconductor region comprising the first semiconductor region and the third semiconductor layer and surrounded by the trench; a gate insulating layer formed on the side wall of the island semiconductor region; a gate electrode layer formed on the gate insulating layer; a first electrode layer formed on at least a portion of the first semiconductor region; and a second electrode layer formed on a surface of the first semiconductor layer.

There is also provided a process for manufacturing a silicon carbide semiconductor device, comprising a first step of forming a stack of a first semiconductor layer of a first conductive-type, a second semiconductor layer of the first conductive-type having an electric resistance higher than that of the first semiconductor layer, and a third semiconductor layer of a second conductive-type different from the first conductive-type in this order from the bottom to the top so as to form a single crystal silicon carbide semiconductor structure, the single crystal silicon carbide semiconductor substrate having a main surface on a side of the third semiconductor layer; a second step of forming a first semiconductor region of the first conductive-type in a predetermined region of the third semiconductor layer; a third step of forming a trench extending from the main surface through the first semiconductor region and the third semiconductor layer and reaching the second semiconductor layer, the trench having a side wall exposing the first semiconductor region and the third semiconductor layer and a bottom exposing the second semiconductor layer, so as to form an island semiconductor region comprising the first semiconductor region and the third semiconductor layer and surrounded by the trench; a fourth step of forming a gate insulating layer on the side wall of the island semiconductor region; a fifth step of forming a gate electrode layer on the gate insulating layer; a sixth step of forming a first electrode layer on at least a portion of the first semiconductor region; and a seventh step of forming a second electrode layer on a surface of the first semiconductor layer.

In the above device of the present invention, the silicon carbide semiconductor device has an island semiconductor region defined by the side walls of the trench of the vertical insulating gate-type field effect transistor and constituting a channel section, and has a gate insulating film formed on the trench side walls surrounding the island semiconductor region. In other words, the island semiconductor region is surrounded by the gate insulating film.

In preferred embodiments of the present invention, the following features may be provided.

(1) The island semiconductor region has a polygonal shape in a plan view from the top of the stack and each of the inner angles of the polygonal shape is less than 180°.

(2) Each side of the polygonal shape is almost in parallel with [1$\bar{1}$00] and the gate insulating layer is a thermally oxidized layer formed by thermal oxidation in a wet atmosphere.

(3) The polygonal shape is a hexagonal shape having substantially equal inner angles.

(4) The main surface of the single crystal silicon carbide semiconductor region has a carbon face of (000$\bar{1}$) the island semiconductor region has side walls each extending in the direction of [11$\bar{2}$0], and the semiconductor device further comprises a second semiconductor region of silicon carbide extending on the side walls of the first semiconductor region, the third semiconductor layer and the second semiconductor layer, the second semiconductor region having a surface on which the gate insulating layer is formed.

BRIEF DESCRIPTION OF THE DRAWINGS

FIG. 1A is a plan view to illustrate a conventional semiconductor device, and FIG. 1B is a partial enlarged view of FIG. 1A;

FIG. 2A is a plan view to illustrate the concept of the semiconductor device of the invention, and FIG. 2B is a partial enlarged view of FIG. 2A;

FIGS. 18A and 18B are sketches illustrating the orientation of epitaxial growth of a silicon carbide semiconductor material within the (0001) plane, wherein FIG. 18A is a sketch of a Nomarski photograph before epitaxial growth and FIG. 18B is a sketch of a Nomarski photograph after epitaxial growth.

DETAILED DESCRIPTION OF THE PREFERRED EMBODIMENTS

Figure 3:
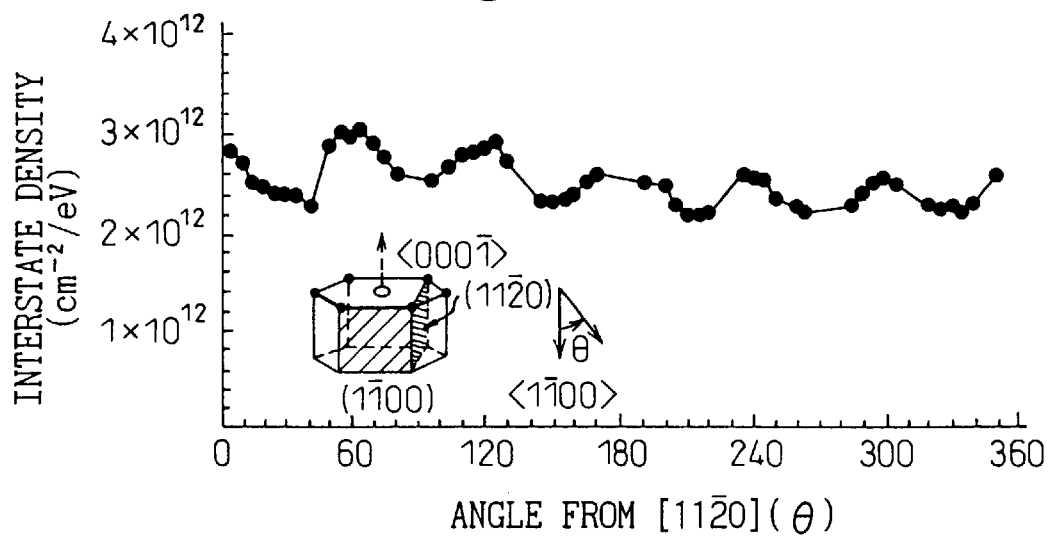
FIG. 3 is a characteristic drawing showing plane orientation dependence of interstate density in a hexagonal silicon carbide semiconductor.

The present invention will now be explained in further detail by way of experiments conducted by the present inventors and observations based on their results.

First, for the purpose of obtaining a high-reliability gate insulating film, it was assumed that by lowering the interstate density originating from the carbon atoms, it would be possible to obtain a high-reliability insulating film as a gate insulating film with an extended lifetime.

The present inventors designed MOSFETs wherein vertical insulating gate-type field effect transistors made of silicon carbide monocrystal substrates had trench side walls with triangular, square, hexagonal, circular and other plan shapes, and manufactured and evaluated samples with trenches formed inside and with trenches formed outside. As a result it was found that the lifetime of gate insulating films is relatively longer when the trenches are formed outside.

The reason for this will be explained with reference to FIGS. 1A, 1B, 2A and 2B. FIGS. 1A and 2A are plan views of vertical insulating gate-type field effect power MOSFETs made of silicon carbide which show a p-type silicon carbide semiconductor layer 3 forming a channel region (an island semiconductor region 12 in FIGS. 2A and 2B) and a trench 7 and gate insulating film 8. FIGS. 1B and 2B are partial enlarged views of FIGS. 1A and 2A, respectively. In FIGS. 1A and 1B, square trenches 7 are formed in the p-type silicon carbide semiconductor layer 3, while in FIGS. 2A and 2B the trenches 7 form island semiconductor regions 12. That is, the examples shown in FIGS. 1A and 1B have trenches formed inside, while those in FIGS. 2A and 2B have trenches formed outside.

As shown in FIG. 1B which is a partial enlarged view of FIG. 1A and where the trenches are formed inside, it is seen that in the oxide film at corner A where channel side meets channel side, the diffusion of carbon atoms generated by thermal oxidation during formation of the gate insulating film is suppressed resulting in a region of high carbon atom density, and therefore it was concluded that the exceedingly high interface level density originating from carbon atoms at the corner where channel side meets channel side causes the reduction in reliability of the gate insulating film.

On the other hand, as shown in FIG. 2B which is a partial enlarged view of FIG. 2A and where the trenches are formed outside, it is seen that in the oxide film at corner where channel side meets channel side, there is no suppression of the diffusion of carbon atoms generated by thermal oxidation during formation of the gate insulating film, and thus no region of particularly high carbon atom density. This was thought to be the reason for the lack of reduction in reliability of the gate insulating film due to the concentration of carbon atoms generated by thermal oxidation.

The reason for which the diffusion of carbon atoms, generated by thermal oxidation during formation of the gate insulating film, differs depending on whether the trenches are formed inside or whether the trenches are formed outside is believed to be that the path of diffusion of carbon atoms during thermal oxidation as shown by the arrows in FIG. 1B and FIG. 2B is especially densified at the corner sections when the trenches are formed inside as in FIG. 1B, while densification of the route does not occur when the trenches are formed outside as in FIG. 2B. That is to say, when the trenches are formed inside, depressed regions are created so that the carbon atoms cannot easily diffuse during thermal oxidation, whereas when the trenches are formed outside, raised sections are formed instead of depressed regions, and therefore the carbon atoms diffuse easily during thermal oxidation.

As explained above, therefore, the reliability of the gate insulating film can be increased by forming the trenches outside.

In order to deal with the fact that the channel mobility was still low, the present inventors conducted further study and experimentation in regard to surface shape dependency of transistor trench side walls, crystal plane orientation dependency of channel sides and dependency on gate insulating film-forming conditions, all of which affect the electrical characteristics of transistors.

MOSFETs were fabricated with the plane orientation of the channel side of the vertical insulating gate-type field effect transistor having the carbon $(000\bar{1})$ plane as its main surface $(000\bar{1})$, i.e. the trench side wall, shifted at progressive angles of 5°, and the channel mobility of each was evaluated. As a result, channel mobility with a periodicity of 60° was exhibited in the MOSFETs whose gate insulating films were formed by thermal oxidation in a wet atmosphere (i.e., including moisture), and a huge channel mobility was exhibited when the plane orientation of the channel side was parallel to $[1\bar{1}00]$. Furthermore, a very small interstate density was estimated when the orientation was parallel to $[1\bar{1}00]$. FIG. 3 shows the plane orientation dependency of the interstate density as determined by the present inventors. With MOSFETs whose gate insulating films were formed by thermal oxidation in a dry atmosphere, the channel mobility was lower and the interstate density was larger compared to MOSFETs formed in a wet atmosphere, and no strong plane orientation dependency was exhibited.

This result indicates that the interstate density resulting from the crystal structure of hexagonal silicon carbide semiconductors is an important factor responsible for reduction in channel mobility.

The present inventors reached the conclusion that the origin of the interstate density of MOSFETs made of silicon carbide semiconductors differs from cases where the silicon semiconductor consists of a single element, with the carbon atoms in the channel side playing an important role, and that the drastically (more than ten times) higher interstate density exhibited with respect to MOSFETs made of silicon semiconductors is due to the carbon atoms. The reason is that in hexagonal silicon carbide the interstate density at the (000$\bar{1}$) carbon face was larger than at the (0001) silicon face, and also that the experimentally obtained distribution of the interface level density in FIG. 3 had a close correlation with the carbon atom density per unit area mathematically calculated from the crystal structure.

Figure 15:
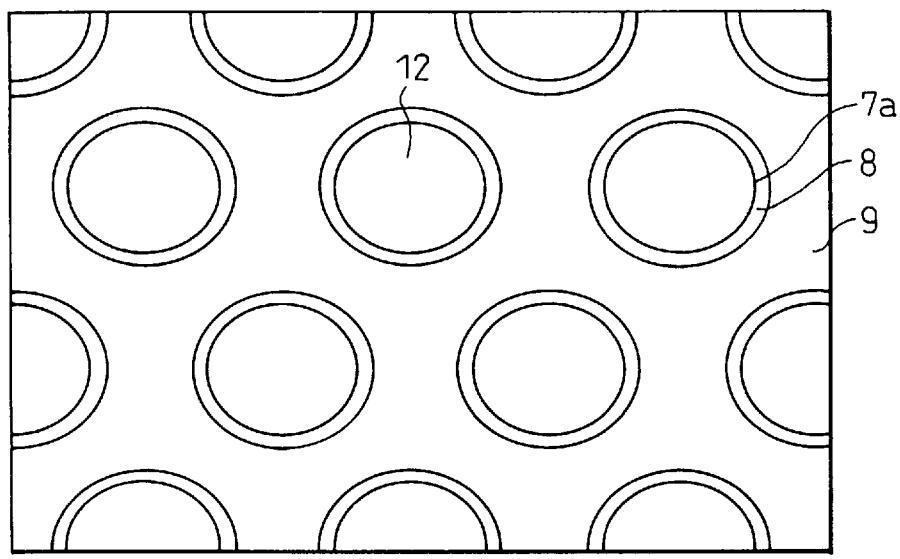
FIGS. 15 and 16 are plan views of substrates to illustrate the application examples.

It was therefore concluded that the improved channel mobility of MOSFETs made of silicon carbide can be achieved by a maximum reduction in the density of carbon atoms present in the gate oxidized film and by lowering the interstate density resulting from the carbon atoms. This was experimentally confirmed by the present inventors to be effectively achieved by making the channel side parallel to [1,$\bar{1}$00] and forming the gate insulating film by thermal oxidation in a wet atmosphere. Furthermore, even when the trenches are formed outside as shown in FIG. 15, since the carbon atoms are left behind in the gate insulating film so that no dense regions exist, the channel mobility may be improved by lowering the interstate density resulting from the carbon atoms.

Consequently, according to the present invention there are formed island semiconductor regions surrounded by the trench side walls of the vertical insulating gate-type field effect transistor and serving as channel sections and therefore, since the trenches are formed outside and the gate insulating film is formed on the trench side walls of the island semiconductor regions, when the gate insulating film is formed by thermal oxidation, the carbon atoms generated by oxidation of the silicon carbide can be more easily diffused in the atmosphere than when the trenches are formed inside, thus making it possible to eliminate the increase in interstate density caused by a lack of diffusion of carbon atoms, and to improve the channel mobility and the lifetime of the gate oxidized film.

If the above-mentioned island semiconductor regions are given polygonal shapes, the planar design can be achieved more easily. It is also possible to eliminate the increase in interstate density caused by a lack of diffusion of carbon atoms by making all of the inner angles of the polygon less than 180°.

In addition, if the sides of the polygon, i.e. the trench side walls, are made parallel to the [1$\bar{1}$00] direction, it is possible to create a MOS interface at the side with minimum carbon atom density based on the silicon carbide crystal structure, and thus effectively reduce the interface level density, as shown by the experimental results obtained by the present inventors.

Also, if the planar shape of the side walls is hexagonal with approximately equal inner angles, the angles formed by the inner angles with each well of the hexagon will be approximately 120°. Accordingly, when a high voltage is applied between the source and drain during the off times of the vertical insulating gate-type field effect transistor, the semiconductor sections formed by the hexagonal trenches whose side walls form hexagons will be less prone to avalanche breakdown resulting from field concentration. That is, although the walls of the polygon can be arranged in predetermined directions by using triangular or diamond-shapes, these avalanche breakdown due to field concentration, whereas with hexagons no such acute-angle sections exist to that shapes have acute-angle sections which tend to result in avalanche breakdown occurs less readily. Consequently, in terms of the breakdown voltage design between source and drain, a greater breakdown voltage design can be achieved by considering the impurity concentration and the film thickness of the second semiconductor layer and the third semiconductor layer.

Embodiments of the invention will now be explained with reference to the drawings.

Figure 4:
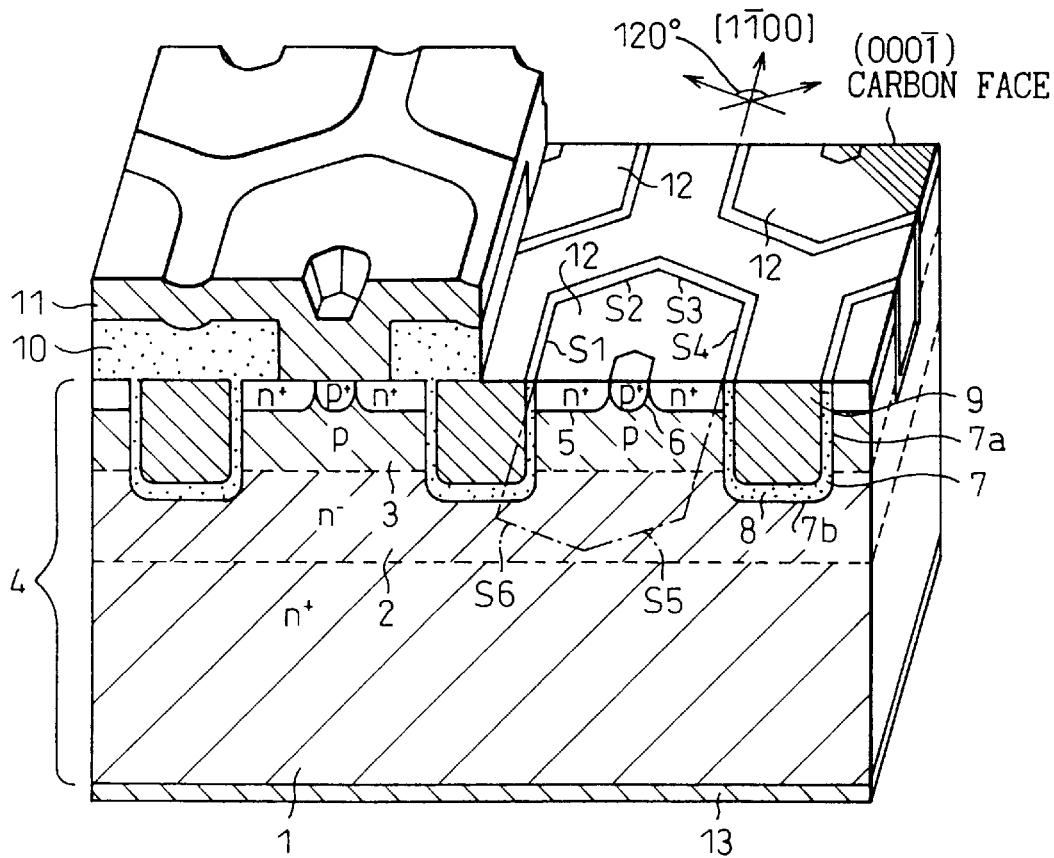
FIG. 4 is a perspective view of a vertical power MOSFET.

FIG. 4 shows an embodiment of an n-channel type vertical insulating gate-type field effect transistor (hereunder referred to as vertical power MOSFET).

An $n^+$-type silicon carbide semiconductor substrate 1 as the low-resistance semiconductor layer employs hexagonal silicon carbide. On the $n^+$-silicon carbide semiconductor substrate 1 are laminated an $n^-$-type silicon carbide semiconductor layer 2 as a high-resistance semiconductor layer and a p-type silicon carbide semiconductor layer 3 in that order.

Thus is formed a semiconductor substrate 4 made of single crystal silicon carbide, comprising an $n^+$-type silicon carbide semiconductor substrate 1, an $n^-$-type silicon carbide semiconductor layer 2 and a p-type silicon carbide semiconductor layer 3, with the top face thereof as the (000$\bar{1}$) carbon face.

On a predetermined region on the surface layer section of the p-type silicon carbide semiconductor layer 3 there is formed an $n^+$-type source region 5 as the semiconductor region. In addition, a low-resistance p-type ($p^+$-type) silicon carbide region 6 is formed in a predetermined region on the surface section in the p-type silicon carbide semiconductor layer 3.

A trench 7 is formed in a predetermined region of the $n^+$-type source region 5, and the trench 7 passes through the $n^+$-type source region 5 and the p-type silicon carbide semiconductor layer 3, reaching the $n^-$-type silicon carbide semiconductor layer 2.

The trench 7 has side walls 7a perpendicular to the surface of the semiconductor substrate 4 and a bottom side 7b parallel to the surface of the semiconductor substrate 4. The hexagonal region surrounded by the side walls 7a of the trench 7 (shown as a partial hexagonal shape in FIG. 4) is the island semiconductor region 12. That is, the island semiconductor region 12 represents a plurality of regions each provided with a p-type silicon carbide semiconductor layer 3 formed on the $n^-$-type silicon carbide semiconductor layer 2 and an $n^+$-type source region 5 formed on the p-type silicon carbide semiconductor layer 3 and low-resistance p-type silicon carbide region 6, and separated from the other island semiconductor regions 12. Also, in this embodiment the side walls 7a of the trench 7 are established approximately in the [1$\bar{1}$00] direction. The planar shape of the side walls 7a of the trench 7 is hexagonal with approximately equal inner angles. That is, as shown in the plan view of the substrate 4 in FIG. 5, the six sides of the hexagon, indicated by S1, S2, S3, S4, S5 and S6, form angles of approximately 120° as the (inner) angle between sides S1 and S2, the (inner) angle between sides S2 and S3, the (inner) angles between sides S3 and S4, the (inner) angle between sides S4 and S5, the (inner) angle between sides S5 and S6, and the (inner) angle between sides S6 and S1. As a result of formation of these island semiconductor regions 12, no depressed regions are formed within the planar shape.

A gate insulating film 8 is formed on the side walls 7a of the trench and on the bottom side 7b of the trench. The inner side of the gate insulating film 8 in the trench 7 is filled with a gate electrode layer 9. The gate electrode layer 9 is covered with an insulating film 10. A source electrode layer 11 is formed as a first electrode layer on the surface of the n⁺-type source region 5 and the low-resistance p-type silicon carbide region 6. On the surface of the n⁺-type silicon carbide semiconductor substrate 1 (the backside of the semiconductor 4) there is formed a drain electrode 13 as a second electrode layer.

Figure 5:
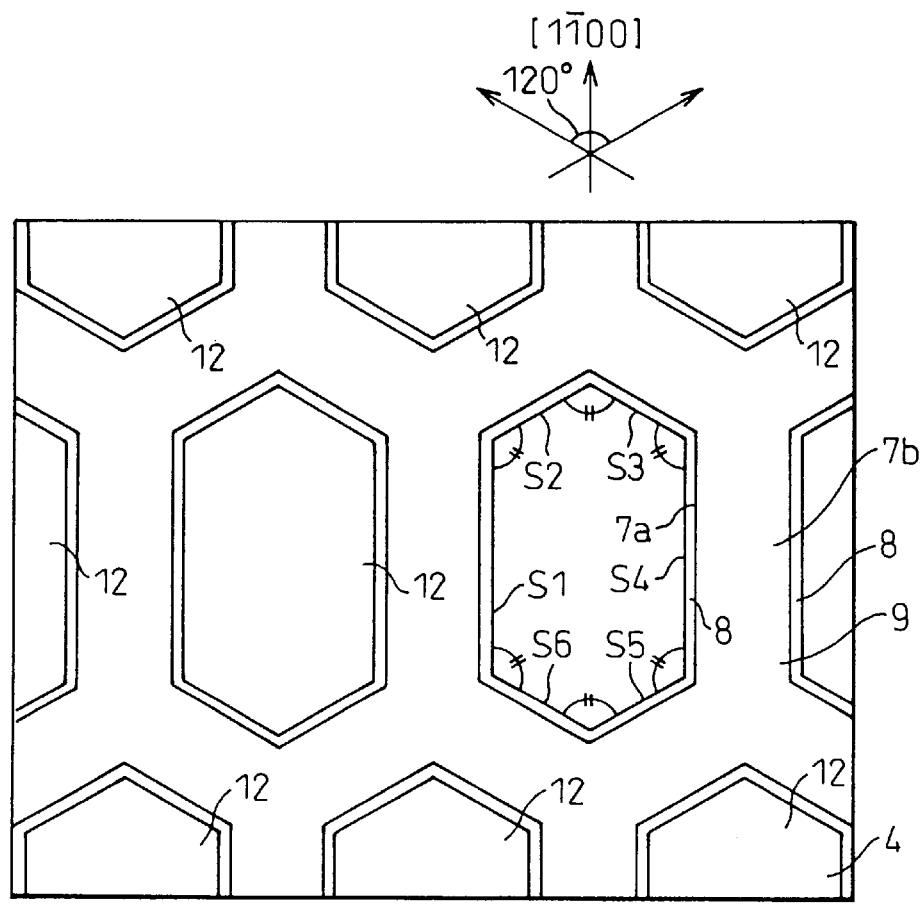
FIG. 5 is a plan view of a substrate.

Thus, the vertical power MOSFET has the channel-forming side parallel to the [1$\bar{1}$00] direction, with the trenches arranged outside the hexagonal island semiconductor region 12 as shown in FIG. 5.

A manufacturing process for the vertical power MOSFET will now be explained with reference to FIGS. 6 to 11.

Figure 6:
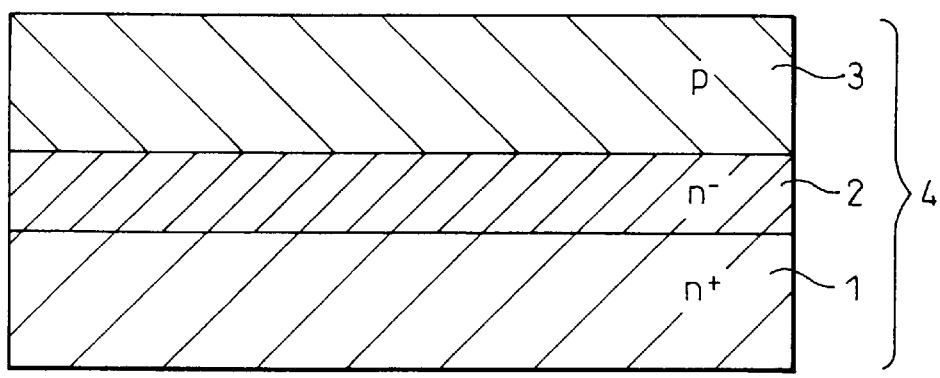
FIGS. 6 to 11 are cross-sectional views to illustrate a manufacturing process for a vertical power MOSFET.

First, as shown in FIG. 6, an n⁺-type silicon carbide semiconductor substrate 1 is prepared having its main surface at approximately the (000$\bar{1}$) carbon face, and epitaxial growth of an n⁻-type silicon carbide semiconductor layer 2 on its surface is followed by further epitaxial growth of a p-type silicon carbide semiconductor layer 3 on the n⁻-type silicon carbide semiconductor layer 2. Thus is formed a semiconductor substrate 4 comprising an n⁺-type silicon carbide semiconductor substrate 1, an n⁻-type silicon carbide semiconductor layer 2 and a p-type silicon carbide semiconductor layer 3.

Figure 7:
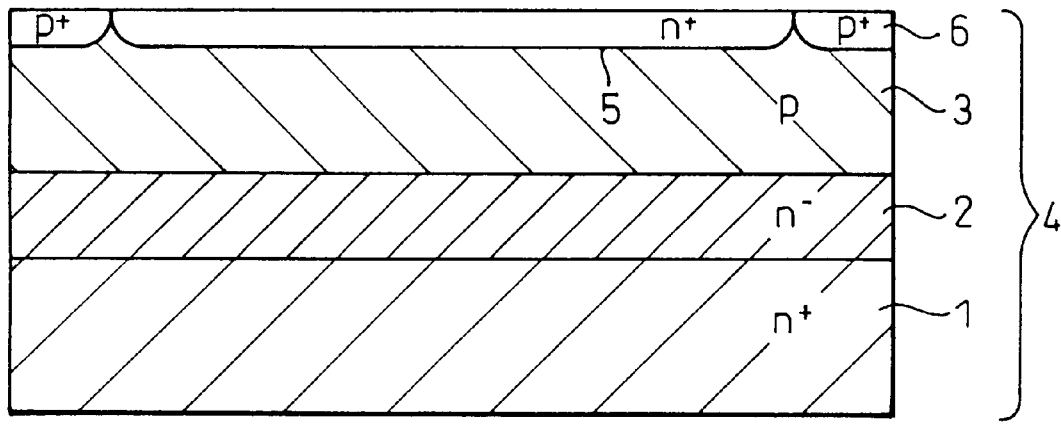

Next, as shown in FIG. 7, an n⁺-type source region 5 is formed, by nitrogen ion implantation for example, on a predetermined region of the surface section of the p-type silicon carbide semiconductor layer 3. A low-resistance p-type silicon carbide region 6 is also formed, by aluminum ion implantation for example, on a predetermined region of the surface section of the p-type silicon carbide semiconductor layer 3.

Figure 8:
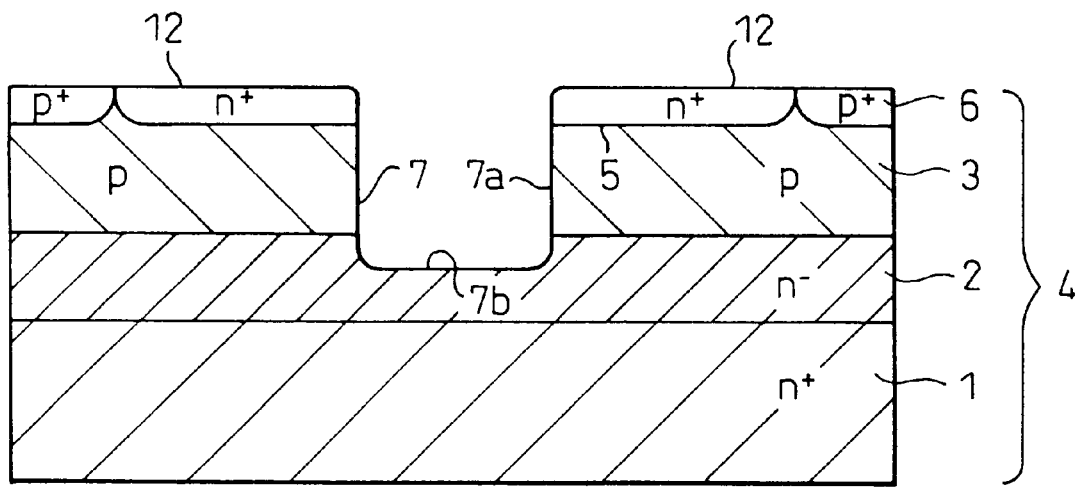

Also, as shown in FIG. 8, a trench 7 is formed, by a dry etching method such as RIE (reactive ion etching) for example, passing through the n⁺-type source region 5 and the p-type silicon carbide semiconductor layer 3, reaching the n⁻-type silicon carbide semiconductor layer 2. At this time, the side walls 7a of each trench 7 form the trench 7 in a direction parallel to the [1$\bar{1}$00] direction, creating an island semiconductor region 12. Thus, as shown in FIG. 5, the shape of the island semiconductor region 12 in the plan view of the vertical power MOSFET is hexagonal on its main surface.

Figure 9:
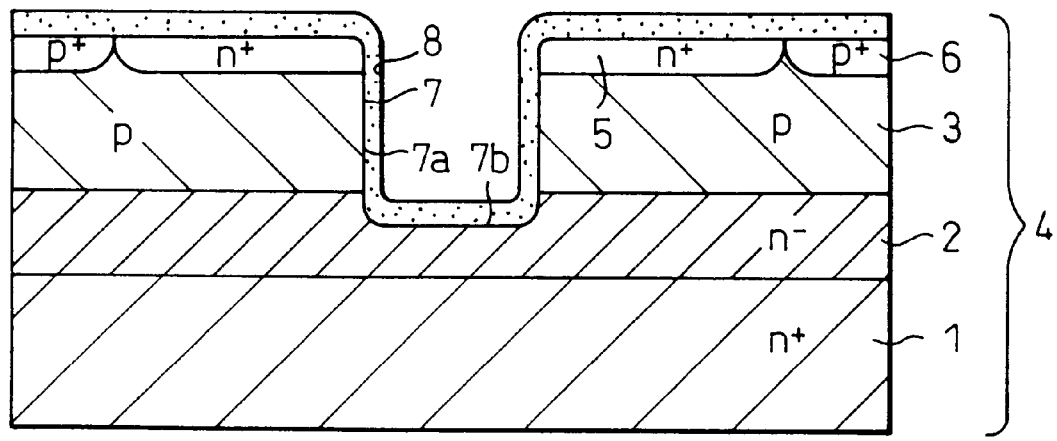
Figure 10:
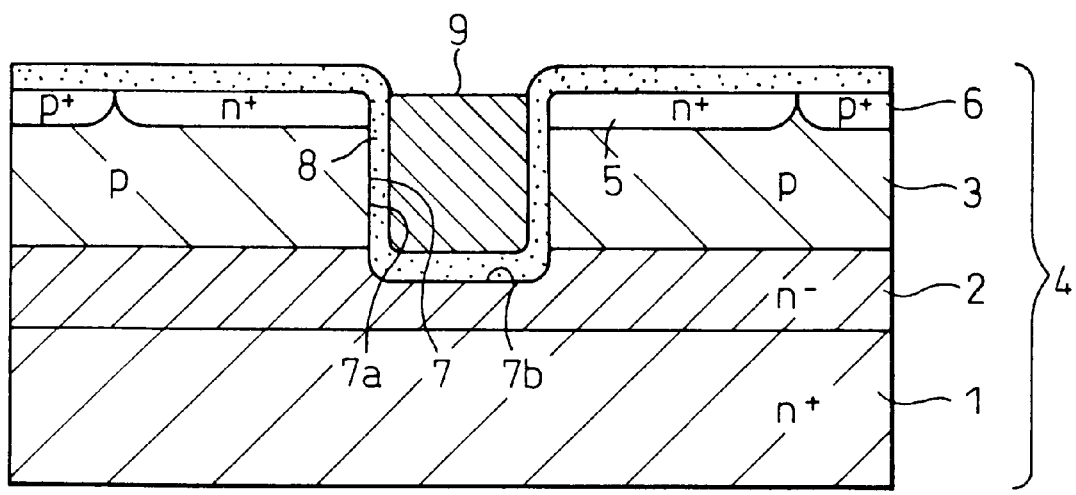
Figure 11:
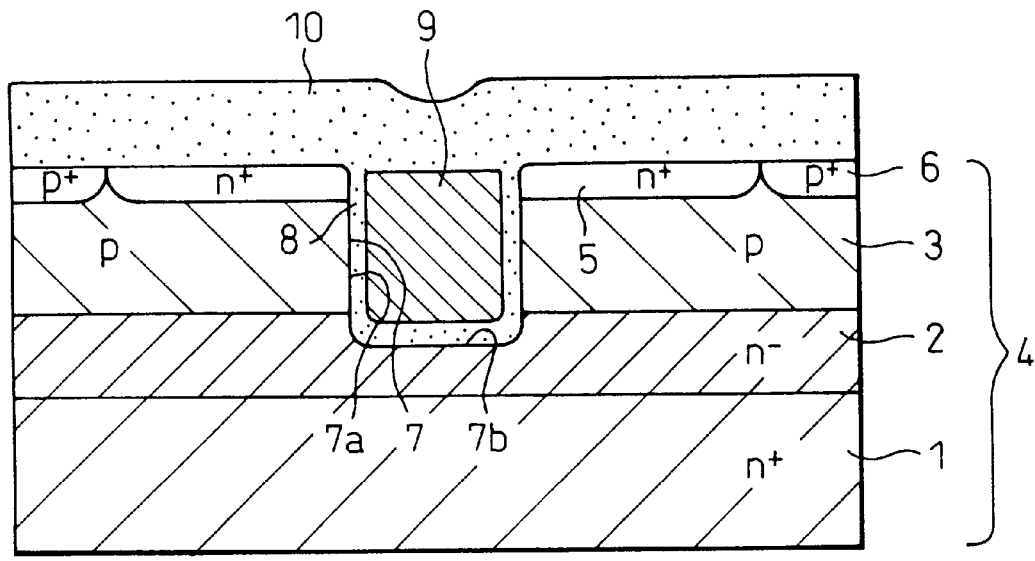

Next, as shown in FIG. 9, a gate insulating film 8 is formed on the surfaces of the semiconductor substrate 4 and on the side walls 7a of the trench and on the bottom side 7b of the trench. Here, the gate insulating film 8 is formed by thermal oxidation in a wet atmosphere. This wet oxidation was accomplished by a method known as the pyrogenic method, with film-forming conditions whereby the semiconductor substrate 4 having the trench 7 formed thereon was situated in a thermal oxidizing furnace, the furnace temperature was raised to 1100° C., hydrogen (H₂) and oxygen (O₂) were admitted at a ratio of 4:3, the hydrogen and oxygen were burned to produce water vapor, and a thermal oxide film was formed by the water vapor and oxygen. In this embodiment, the growth rate of the oxide film was 25 nm/h, and the film was grown to 100 nm. In contrast, dry oxidation is a method whereby oxygen alone is supplied to form an oxide film. Also, as shown in FIG. 10, the inside of the gate insulating film 8 of the trench is filled with a gate electrode layer 9. Furthermore, as shown in FIG. 11, an insulating film 10 is formed on the gate electrode layer 9. Then, as shown in FIG. 4, a source electrode layer 11 is formed on the source region 5 which include the insulating film 10 and the low-resistance p-type silicon carbide region 6. Also, a drain electrode layer 13 is formed on the surface of the n⁺ silicon carbide semiconductor substrate 1 to thus complete the trench gate-type power MOSFET.

As explained above, according to this embodiment a high-reliability gate insulating film 8 can be obtained since the island semiconductor region 12 is surrounded by the side walls 7a of the trench 7, no depression is formed in the island semiconductor region 12 in the plan view as shown in FIG. 2, and the gate insulating film 8 is formed on the side walls 7a of the trench 7. It is also possible to reduce the interstate density and improve the channel mobility for a reduced on resistance.

Also, since according to this embodiment the side walls 7a of the trench 7 forming the channels of the vertical MOSFET are formed parallel to the [1$\bar{1}$00] direction and the gate insulating film 8 is formed by wet oxidation on the side walls 7a of the trench 7, it is possible to achieve maximum reduction in the interface level as shown in FIG. 3, and thus to improve the channel mobility and provide a transistor with on effectively reduced on resistance.

In addition to the construction described above, different materials may also be used for the source electrodes formed on the n⁺-type source region 5 and low-resistance resistance p-type silicon region 5. The low-resistance p-type source region 6 may also be omitted, in which case the source electrode layer 11 is formed in contact with the n⁺-type source region 5 and p-type silicon carbide semiconductor layer 3. The source electrode layer 11 need only be formed at least on the surface of the n⁺-type source region 5.

The embodiment described above was explained as an application to n-channel vertical MOSFETs, but the same effect may be achieved with p-channel vertical MOSFETs, where the p-type and n-type are switched as in FIG. 4.

Figure 12:
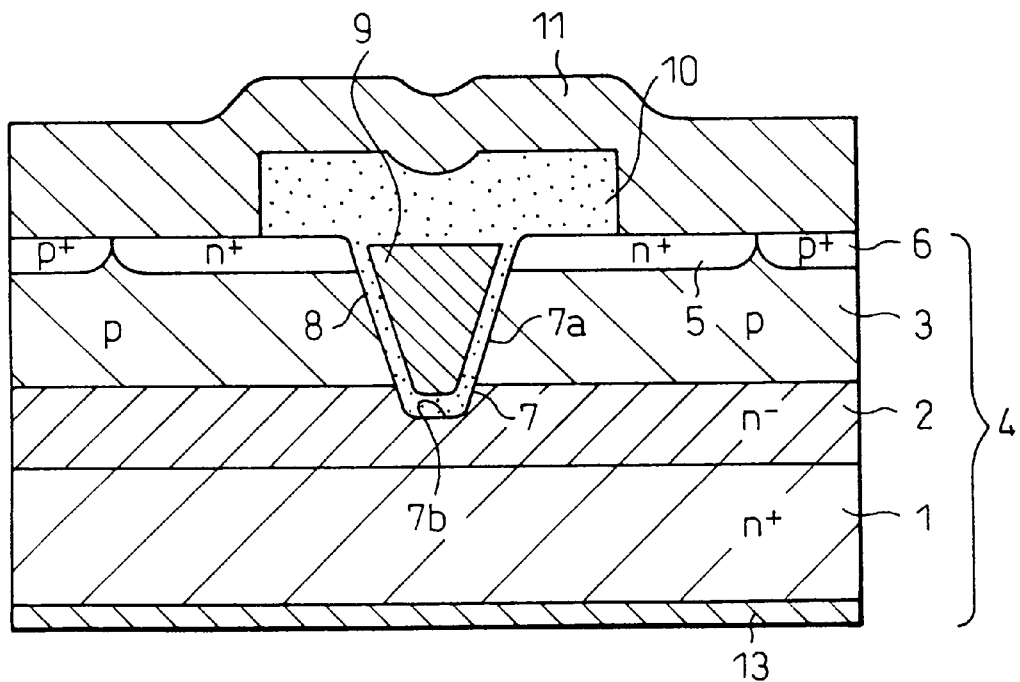
FIGS. 12 to 14 are cross-sectional view of application examples of vertical power MOSFETs.
Figure 13:
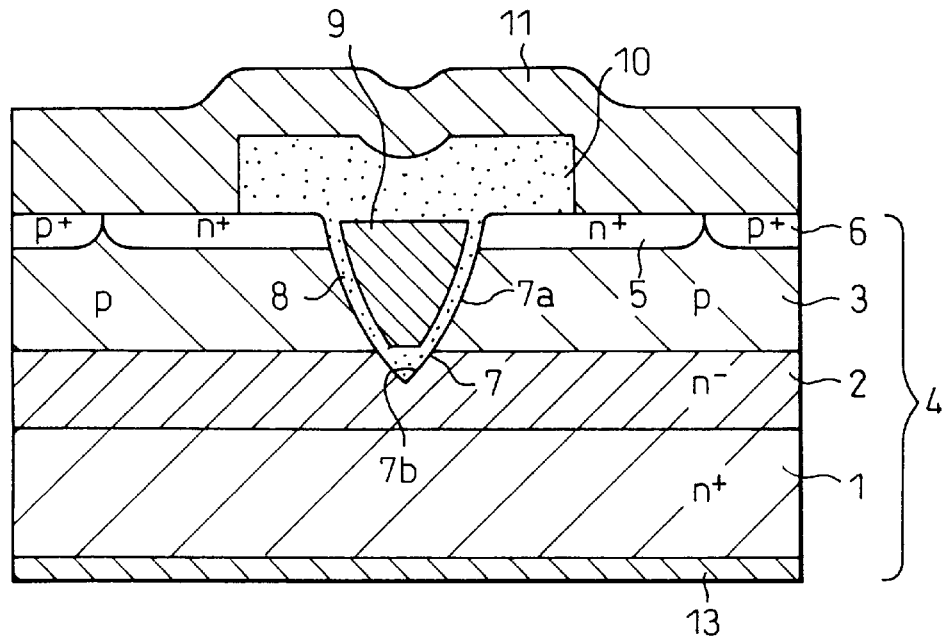

Also, although the trench 7 has side walls 7a at approximately 90° with the substrate surface in FIG. 4, as in FIG. 12 the angles formed between the side walls 7a of the trench and the substrate surface need not be near 90°. Moreover, the trench 7 can be V-shaped to eliminate the bottom side. Also, as shown in FIG. 13, the side walls 7a of the trench 7 need not be flat, and may even be gently curved. Incidentally, an even better effect can be obtained by forming the angle between the side walls 7a of the trench 7 and the substrate surface in such a manner as to create a design for greater channel mobility.

Figure 14:
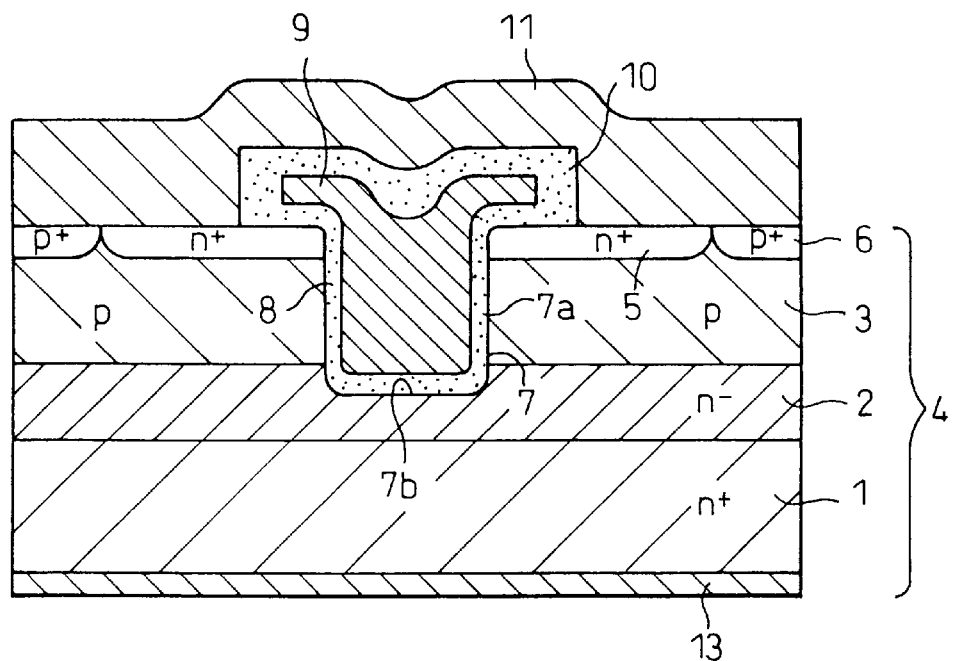

As shown in FIG. 14, the upper section of the gate electrode 9 may also extend above the n⁺-type source region 5.

Figure 16:
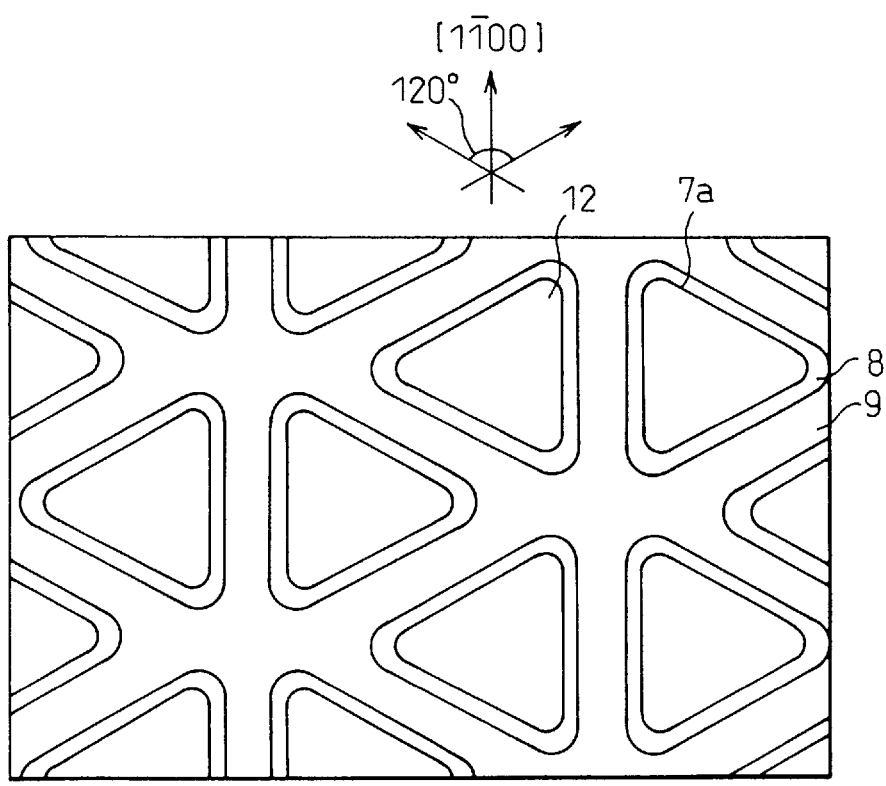

Also, while the surface shape of the island semiconductor region 12 is hexagonal in this embodiment, the effect of the present invention can be expected even if it is a smooth ellipse or circles as in FIG. 15, or triangular as in FIG. 16, so long as the trenches are formed outside.

Another embodiment of the invention will now be explained with reference to FIGS. 17, 18A and 18B.

Figure 17:
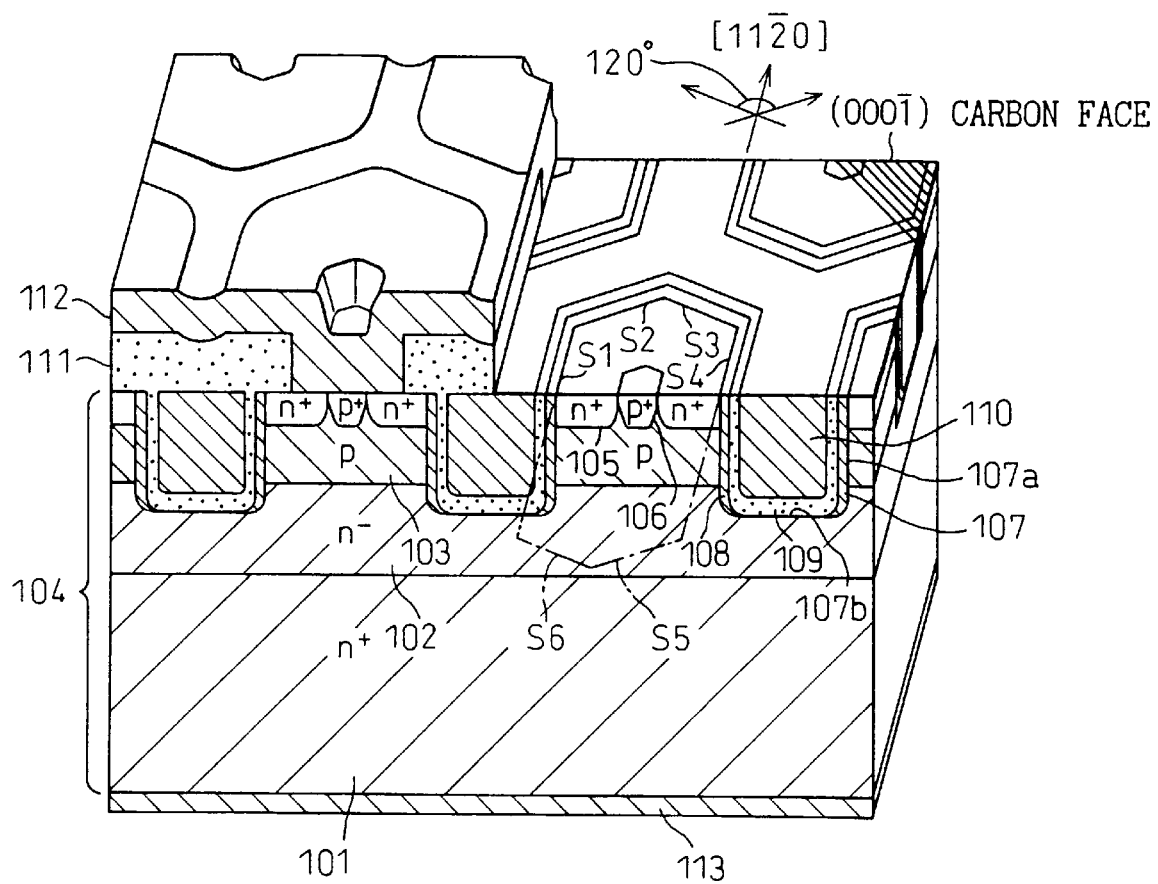
FIG. 17 is a perspective view to illustrate another embodiment of an n-channel trench gate-type power MOSFET.
Figure 18A:
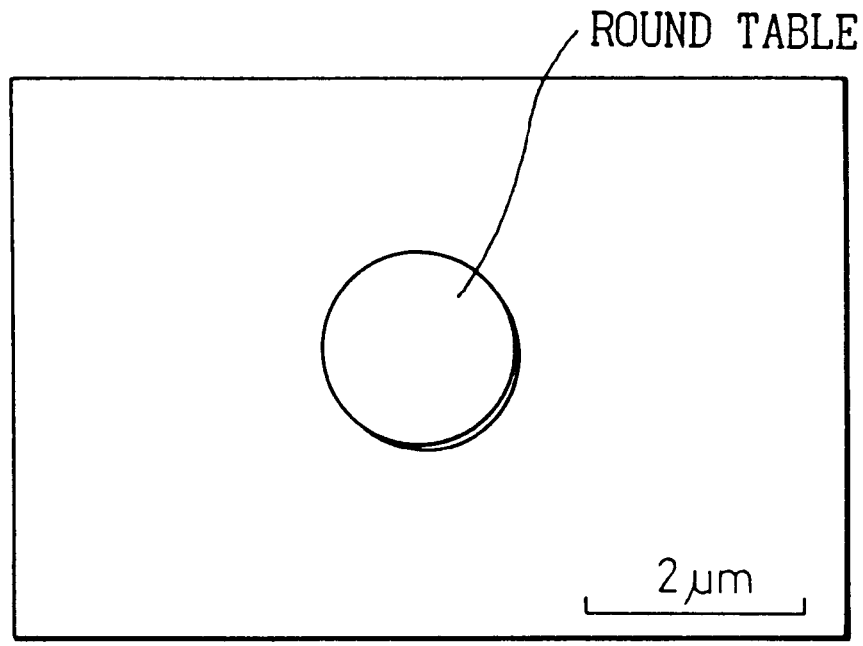
Figure 18B:
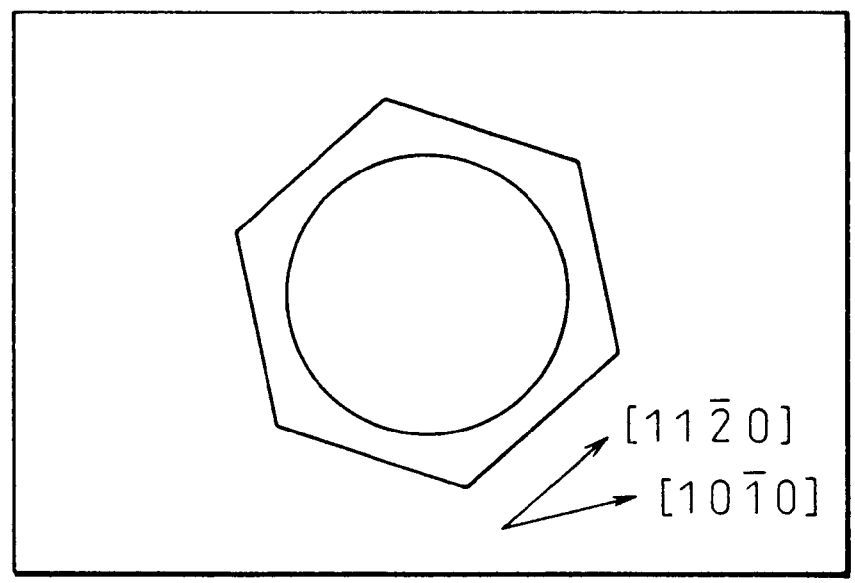

FIG. 17 shows an n-channel trench gate-type power MOSFET (vertical-type power MOSFET) according to the present embodiment. The n⁺-type silicon carbide semiconductor substrate 101 as the low-resistance semiconductor layer is made of hexagonal crystal silicon carbide. This n⁺-type silicon carbide semiconductor substrate 101 is laminated with an n⁻-type silicon carbide semiconductor layer 102 and a p-type silicon carbide semiconductor layer 103 in that order as high-resistance semiconductor layers. Thus, there is formed a single crystal silicon carbide semiconductor substrate 104 consisting of an n⁺-type silicon carbide semiconductor substrate 101, an n⁻-type silicon carbide semiconductor layer 102 and a p⁻type silicon carbide semiconductor layer 103, the top side of which is the (000$\bar{1}$) carbon face.

Figure 19:
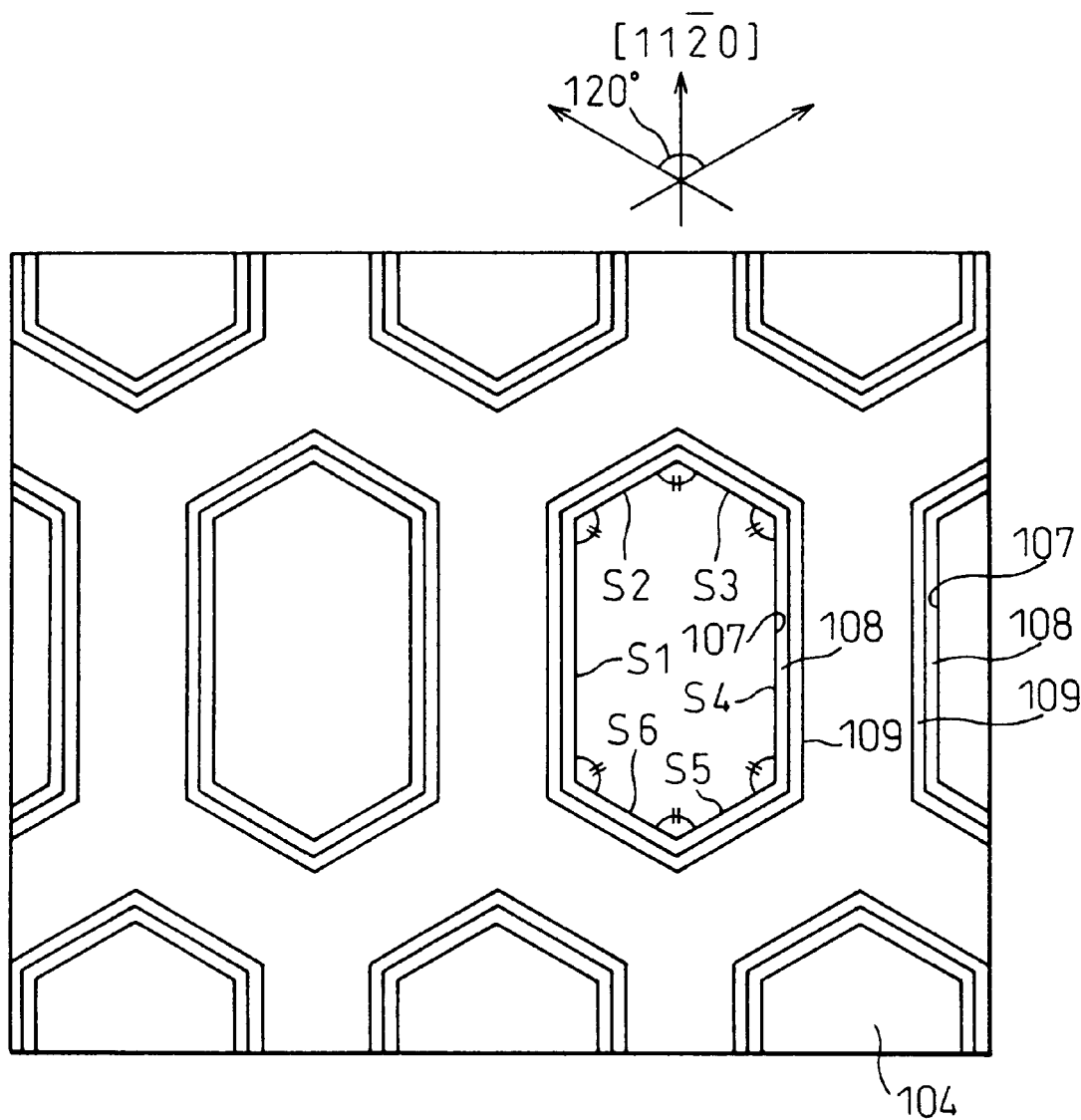
FIG. 19 is a plan view of a substrate.

In a predetermined area on the surface section within the p-type silicon carbide semiconductor layer 103 there is formed an n⁺-source region 105 as a semiconductor region. Also, in a predetermined area on the surface section within the p-type silicon carbide semiconductor layer 103 there is formed a low-resistance p-type silicon carbide region 106. A trench 107 is formed in a predetermined area of the n⁺-type source region 105, and this trench 107 runs through the n⁺-type source region 105 and the p-type silicon carbide semiconductor layer 103 reaching to the n⁻-type silicon carbide semiconductor layer 102. The trench 107 has side walls 107a perpendicular to the surface of the semiconductor substrate 104 and a bottom 107b parallel to the surface of the semiconductor substrate 104. The side walls 107a of the trench 107 extend approximately along the direction of [11$\bar{2}$0]. The planar shape of the side walls 107a of the trench 107 is hexagonal with almost equal inner angles. That is, as shown in the plan view of the substrate 104 in FIG. 19, the six sides of the hexagon, indicated by S1, S2, S3, S4, S5 and S6, form angles of approximately 120° as the (inner) angle between sides S1 and S2, the (inner) angle between sides S2 and S3, the (inner) angle between sides S3 and S4, the (inner) angle between sides S4 and S5, the (inner) angle between sides S5 and S6, and the (inner) angle between sides S6 and S1.

On the surface of the n⁺-type source region 105, the p-type silicon carbide semiconductor layer 103 and the n⁻-type silicon carbide semiconductor layer 102 on the side walls 107a of the trench in FIG. 17, there extends an n-type silicon carbide semiconductor thin-film layer 108 as a fourth semiconductor layer. The n-type silicon carbide semiconductor thin-film layer 108 is a thin-film with a thickness of about 1000–5000Å, and the crystal structure (poly-type) of the n-type silicon carbide semiconductor thin-film layer 108 is the same as the crystal structure (poly-type) of the p-type silicon carbide semiconductor layer 103, such as, for example, 6H—SiC. It may also be 4H—SiC, or 3C—SiC. The impurity concentration of the n-type silicon carbide semiconductor thin-film layer 108 is preferably lower than the impurity concentration of the n⁺-type silicon carbide semiconductor substrate 101 and n⁺-type source region 105.

Also, in the trench, a gate insulating film 109 is formed on the surface of the n-type silicon carbide semiconductor thin-film layer 108 and the bottom 107b of the trench. The inside of the gate insulating film 109 in the trench 107 is filled with a gate electrode layer 110. The gate electrode layer 110 is covered with an insulating film 111. A source electrode layer 112 is formed on the surface of the n⁺-type source region 105 and the surface of the low-resistance p-type silicon carbide region 106, as a first electrode layer. On the surface of the n⁺-type silicon carbide semiconductor substrate 101 (the back side of the semiconductor substrate 104) there is formed a drain electrode layer 113 as a second electrode layer.

The production of the above trench gate-type power MOSFET is described in U.S. Ser. No. 08/785,952, the disclosure of which is incorporated herein by reference.

Thus, the trench gate-type power MOSFET has the channel-forming side in the [11$\bar{2}$0] direction.

According to this embodiment of the present invention, the semiconductor substrate is single crystal hexagonal silicon carbide with a main surface of a carbon face with a face orientation of about (000$\bar{1}$) while the trench extends in the direction of about [11$\bar{2}$0], and a fourth semiconductor layer made of a silicon carbide thin-film is also situated on the sides of the trench. This construction is applied, forming a fourth semiconductor layer made of an impurity concentration-controlled silicon carbide thin-film in an epitaxial manner on the sides of the trench formed by etching followed by thermal oxidation of the surface thereof to form an MOS structure, to thus produce a channel in the fourth semiconductor layer for independent control of the impurity concentration of the channel-forming side and the impurity concentration of the third semiconductor layer, and thereby provide a silicon carbide semiconductor device with high breakdown voltage, low on-resistance and a low threshold voltage. In particular, lowering the impurity concentration of the fourth semiconductor layer forming the channel results in less influence by impurity scattering while the carrier flows, thus providing greater channel mobility. In addition, since the source/drain breakdown voltage is largely governed by the impurity concentration and film thickness of the high-resistance semiconductor layer (second semiconductor layer) and third semiconductor layer, the impurity concentration of the third semiconductor layer may be raised while its film thickness is reduced, the channel length may be shortened while maintaining a high breakdown voltage characteristic, and thus the channel resistance may be reduced with reduction in the on-resistance between the source and drain. Furthermore, since the trench sides extend approximately in the [11$\bar{2}$0] direction, the channel-forming side made of the fourth semiconductor layer consisting of the silicon carbide thin-film may be in the [11$\bar{2}$0] direction, and thus irregularities in the channel-forming side may be vastly reduced. This has been confirmed by the present inventors by experiments on epitaxial growth of silicon carbide. The epitaxial growth of silicon carbide on the trench sides characteristically forms an extremely flat surface selectively in the [1120] direction, and therefore the MOS interface resulting from thermal oxidation of this surface is also flat, and the channel-forming side has less surface scattering of the carrier and the channel mobility may thus be drastically improved. In addition, the fourth semiconductor layer has no crystal defects resulting from ion impact with RIE, and thus loss of mobility may be prevented. The gate oxidation film thickness formed on the channel-forming side is also uniform, with no local electric field concentration, and therefore the gate oxidation film breakdown voltage is improved, providing a highly reliable silicon carbide semiconductor device with a longer gate oxidation film lifetime.

When an SiC single crystal thin-film is formed on the trench side walls by epitaxial growth, it is apparent that there is not only angle dependency with respect to plane {0001}, but also growth rate anisotropy with respect to the direction on plane {0001}. For example, according to T. Kimoto and H. Matsunami: "Two-dimensional nucleation and step dynamics in crystal growth of SiC", Silicon Carbide and Related Materials, Ins. Phys. Conf. Ser. No. 137, Institute of Physics Publishing, Bristol and Philadelphia, pp.55–58 (1993), the epitaxial growth rate is fastest in the [11$\bar{2}$0] direction and slowest in the [1$\bar{1}$00] direction, and therefore growth occurs selectively in the [11$\bar{2}$0] direction. That is, as shown in FIGS. 18A and 18B, when epitaxial growth occurs on a sample of a round mesa-type table formed on a wafer surface, the round mesa-type table shown in FIG. 18A becomes the hexagonal mesa-type table in FIG. 18B, due to growth rate anisotropy in plane {0001}. Here, the hexagonal sides extend in the [1120] direction. The present invention is based on this observation, to realize a trench gate-type power MOSFET provided with a trench-type channel structure, which is satisfactory in terms of both construction and electrical characteristics.

What is claimed is:

1. A silicon carbide semiconductor device, comprising:
   a single crystal silicon carbide semiconductor substrate comprising a stack of a first semiconductor layer of a first conductive-type, a second embodiment layer of the first conductive-layer having an electric resistance higher than that of said first semiconductor layer, and a third semiconductor layer of a second conductive-type different from the first conductive-type in this order from the bottom to the top thereof, and single crystal silicon carbide semiconductor substrate having a main surface on a side of said third semiconductor layer;
   a first semiconductor region of the first conductive-type formed in a predetermined region of said third semiconductor layer;
   a trench extending from said main surface through said first semiconductor region and said third semiconductor layer and reaching said second semiconductor layer, said trench having a side wall exposing said first semiconductor region and said third semiconductor layer and a bottom exposing said second semiconductor layer;
   an island semiconductor region comprising said first semiconductor region and said third semiconductor layer and entirely surrounded by said trench so as to be separated from any other island semiconductor regions;
   a gate insulating layer formed on the side wall of said island semiconductor region;
   a gate electrode layer formed on said gate insulating layer;
   a first electrode layer formed on at least a portion of said first semiconductor region; and
   a second electrode layer formed on a surface of said first semiconductor layer.

2. The silicon carbide semiconductor device according to claim 1, wherein said island semiconductor region has a polygonal shape in a plan view from the tope of said stack and each of the interior angles of said polygonal shape is less than 180°.

3. The silicon carbide semiconductor device according to claim 2, wherein each side of said polygonal shape is almost in parallel with [1100] and said gate insulating layer is a thermally oxidized layer formed by thermal oxidation in a wet atmosphere.

4. The silicon carbide semiconductor device according to claim 3, wherein said polygonal shape is a hexagonal shape having substantially equal interior angles.

5. The silicon carbide semiconductor device according to claim 1, wherein said main surface of said single crystal silicon carbide semiconductor substrate has a carbon face of (000$\bar{1}$), said island semiconductor region has side walls extending in the [11$\bar{2}$0] directions, wherein the trench exposes side walls of the first semiconductor region and third semiconductor layer and at least one of a side wall and a top wall of the second semiconductor layer and said semiconductor device further comprises a fourth semiconductor layer of silicon carbide grown and extending on said side walls of said first semiconductor region and said third semiconductor layer and at least one of the side wall and the top wall of said second semiconductor layer, said fourth semiconductor layer having a surface on which said gate insulating layer is formed; said fourth semiconductor layer separating the first semiconductor region and the third semiconductor layer from the gate insulating layer.

6. The silicon carbide semiconductor device according to claim 1, comprising a plurality of island semiconductor regions separated from each other.

7. The silicon carbide semiconductor device according to claim 5, wherein the fourth semiconductor layer is of the first conductive type.

* * * * *